United States Patent [19]

Seidel

[11] Patent Number: 5,111,072

[45] Date of Patent: May 5, 1992

[54] SAMPLE-AND-HOLD SWITCH WITH LOW ON RESISTANCE AND REDUCED CHARGE INJECTION

[75] Inventor: Durbin L. Seidel, Fort Collins, Colo.

[73] Assignee: NCR Corporation, Dayton, Ohio

[21] Appl. No.: 574,176

[22] Filed: Aug. 29, 1990

[51] Int. Cl.⁵ .................. C11C 27/02; H03K 17/16; H03K 17/687

[52] U.S. Cl. .................. 307/353; 307/491; 307/572; 307/585

[58] Field of Search ........... 307/352, 491, 353, 582, 307/585, 572

[56] References Cited

U.S. PATENT DOCUMENTS

| | | | |
|---|---|---|---|
| 4,308,468 | 12/1981 | Olson | 307/353 |
| 4,410,855 | 10/1983 | Underhill et al. | 328/151 |
| 4,439,693 | 3/1984 | Lucas et al. | 307/353 |
| 4,473,761 | 9/1984 | Peterson | 307/585 |
| 4,559,457 | 12/1985 | Sugawara | 307/352 |
| 4,570,080 | 2/1986 | Swanson | 307/353 |
| 4,584,559 | 4/1986 | Penney | 340/347 |
| 4,585,956 | 4/1986 | Lie | 307/353 |
| 4,611,135 | 9/1986 | Nakayama et al. | 307/572 |
| 4,651,037 | 3/1987 | Ogasawara et al. | 307/572 |
| 4,683,386 | 7/1987 | Kamikawara | 307/585 |
| 4,823,027 | 4/1989 | Takahashi | 307/353 |

Primary Examiner—John Zazworsky
Attorney, Agent, or Firm—James M. Stover

[57] ABSTRACT

An improved sample-and-hold circuit includes a first MOSFET transmission gate connected between an analog input voltage and a storage capacitor. The first transmission gate is constructed to have low on resistance and operates for a predetermined period of time to rapidly charge the capacitor to input voltage. A second, smaller MOSFET transmission gate having reduced charge injection characteristics is connected in parallel with the first gate. The second gate is turned on coincidentally with the first gate but remains on for a short period of time after the first gate has been switched off.

11 Claims, 2 Drawing Sheets dimi# SAMPLE-AND-HOLD SWITCH WITH LOW ON RESISTANCE AND REDUCED CHARGE INJECTION The present invention relates generally to sample-and-hold circuits, and more particularly concerns the solution of charge injection errors in such circuits.

BACKGROUND OF THE INVENTION

Sample-and-hold circuits are used to sample an input voltage at a particular instant of time and hold the instantaneous value of the input voltage for a predetermined period of time. In a simple sample-and-hold circuit a capacitor is utilized to hold the sampled input voltage. An electronic switch provides a means for rapidly charging the capacitor to the sample voltage and then removing the input so that the capacitor can retain the sampled voltage. This stored voltage signal may thereafter be used as an input to other circuits.

While MOS devices are well suited for use as electronic switches, in practice they are not perfect and various departures from the ideal occur. A well-known charge injection problem exists whenever MOS devices are used as switches due to the parasitic capacitance between the source-drain and gate of a MOS switch. Also, during the sample period the MOS switch stores charge in the channel, part of which is injected into the storage capacitor when the switch opens, altering the voltage stored on the capacitor.

The charge injection error introduced by the switch is directly proportional to the size of the MOS switch, therefore voltage offset could be controlled by limiting the size of the switch. However, to permit fast and complete charging of the storage capacitor it is desirable to have a switch with low on-resistance. This requirement for low on-resistance results in the use of a switch which is relatively large compared to the size desired to keep charge injection error at a minimum.

One way of decreasing switch-induced voltage offset in sample-and-hold circuits is shown in U.S. Pat. No. 4,308,468 issued Dec. 29, 1981, to Gaylord G. Olson. The sample-and-hold circuit disclosed therein includes a first MOSFET switch for charging a storage capacitor and second compensating MOSFET switch connected to the node between the capacitor and the first switch. However, this second compensating MOSFET switch is biased so that it never turns on. The control signal provided to the second MOSFET switch is identical in timing but opposite in polarity to the control signal provided to the first switch so that the second switch stores a charge which will offset the switch-induced charge injection error caused by the first switch.

The solution for switch-induced error presented above may reduce charge injection errors but it does not deal with the effects of variations in charge injection characteristics from one switching device to another. Charge injection errors are reduced only so far as the charge injection characteristics of the two switches are identical. The quantity of charge not canceled remains proportional to the size of the switches used.

Other solutions have been proposed for reducing charge injection errors, such as those disclosed in U.S. Pat. Nos. 4,467,227; 4,570,080 and 4,585,956. However, these references present more complicated circuit constructions requiring three or more switches, correction capacitors, feedback circuits, or the use of several timing signals to control switch operations.

OBJECTS OF THE INVENTION

It is therefore an object of the present invention to provide a new and improved sample-and-hold circuit not subject to the foregoing disadvantages.

It is another object of the present invention to provide such a sample-and-hold circuit which is simple in construction.

It is yet another object of the present invention to provide a new and improved switching device which has low on-resistance and reduced switch-induced charge injection characteristics.

It is still a further object of the present invention to provide a new and improved sample-and-hold circuit implemented in CMOS technology and having fast operation and reduced switch-induced charge injection characteristics.

SUMMARY OF THE INVENTION

In the present invention, a reduction in charge injection error is achieved in a sample-and-hold circuit employing two MOS switches connected in parallel between an input terminal for receiving an analog voltage signal and a storage device for storing a charge representative of the analog voltage signal. Each MOS switch selectively provides a current path between the input terminal and the storage device. The first MOS switch is constructed to have a low on resistance and operates for a first predetermined period of time. The second MOS switch is fabricated to have low charge injection characteristics and operates for a second predetermined period of time.

In the described embodiment, the storage device consists of a capacitor and the MOS switches are MOSFET transmission gates. The first MOSFET transmission gate consists of parallel-connected PMOS and NMOS field effect transistors each having a channel width-to-length ratio of 13.2 microns to 2.5 microns. The first transmission gate is placed on for a period of approximately one hundred nanoseconds to charge the capacitor. The second MOSFET transmission gate consists of parallel-connected PMOS and NMOS field effect transistors each having a channel width-to-length ratio of 5.2 microns to 3.5 microns. The second transmission gate is of much smaller width than the first gate to reduce charge injection characteristics and is turned on coincidentally with the first gate but remains on for ten nanoseconds after the first gate has been switched off.

The foregoing and and other objects, features, and advantages of the present invention will become apparent from the following description and the attached drawings.

DETAILED DESCRIPTION OF THE PREFERRED EMBODIMENT

Figure 1:
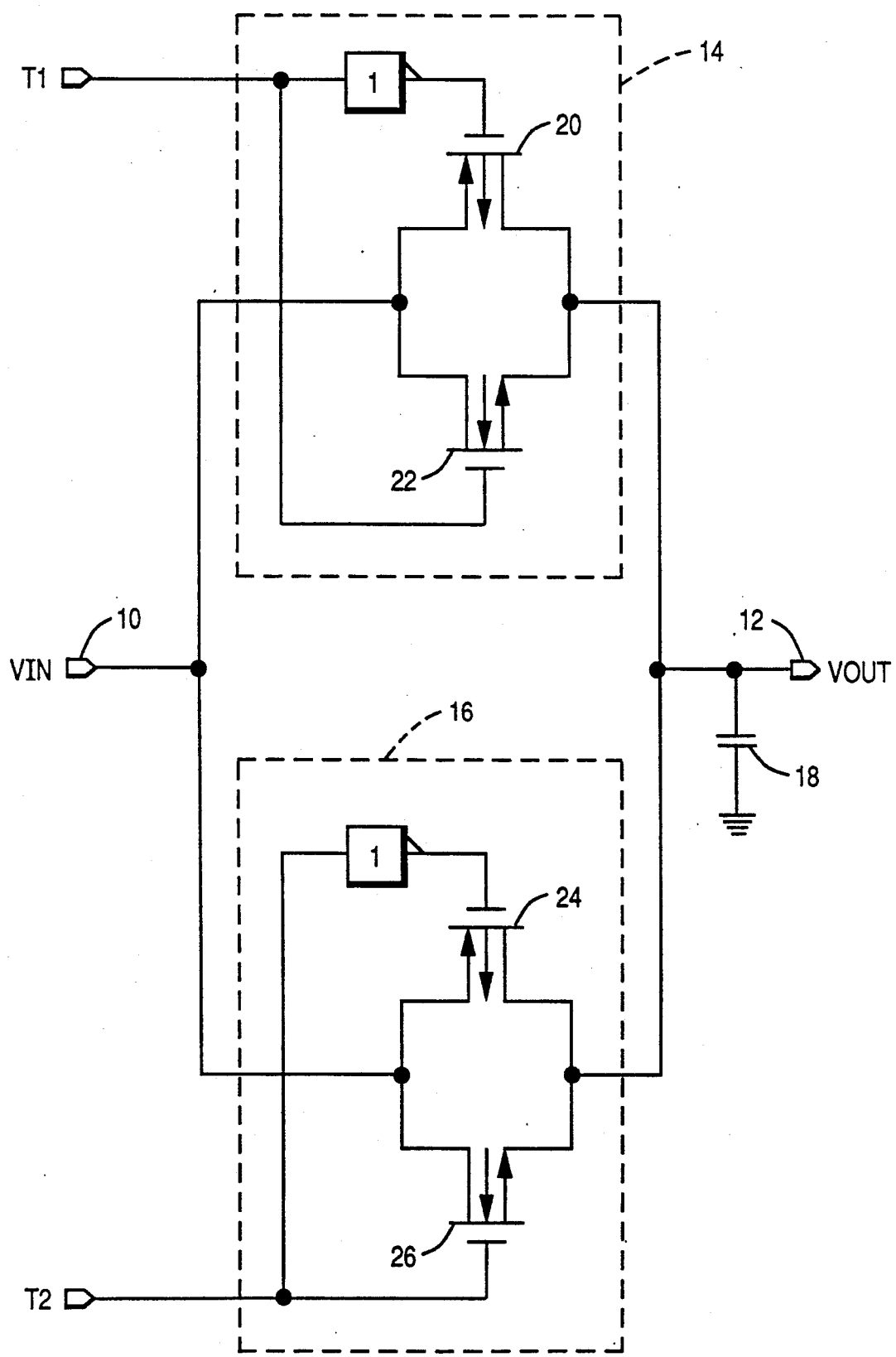
FIG. 1 is a schematic diagram of a sample-and-hold circuit constructed in accordance with the preferred embodiment of the present invention.

A schematic diagram of a sample-and-hold circuit constructed in accordance with the preferred embodiment of the present invention is shown in FIG. 1. The simply constructed circuit includes an input terminal 10, an output terminal 12, first and second MOSFET transmission gates 14 and 16 connected in parallel between terminals 10 and 12, and a storage capacitor 18 connected to the output terminal.

Transmission gate 14 is seen to include a pair of complementary transistors 20 and 22 connected in parallel. PMOS transistor 20 and NMOS transistor 22 are each constructed with a large width-to-length channel ratio to yield a switch having a low on resistance.

Transmission gate 16 is similarly comprised of a PMOS transistor 24 and NMOS transistor 26 connected in parallel. Transistors 24 and 26 are manufactured with a much smaller channel width but larger channel length than transistors 20 and 22 to produce a switch having lower charge injection characteristics and higher resistance than transmission gate 14.

The gates of transistors 22 and 20 are connected to receive a first control signal $T_1$ and the complement of $T_1$, respectively, while transistors 24 and 26 operate in response to a second control signal designated $T_2$.

Figure 2:
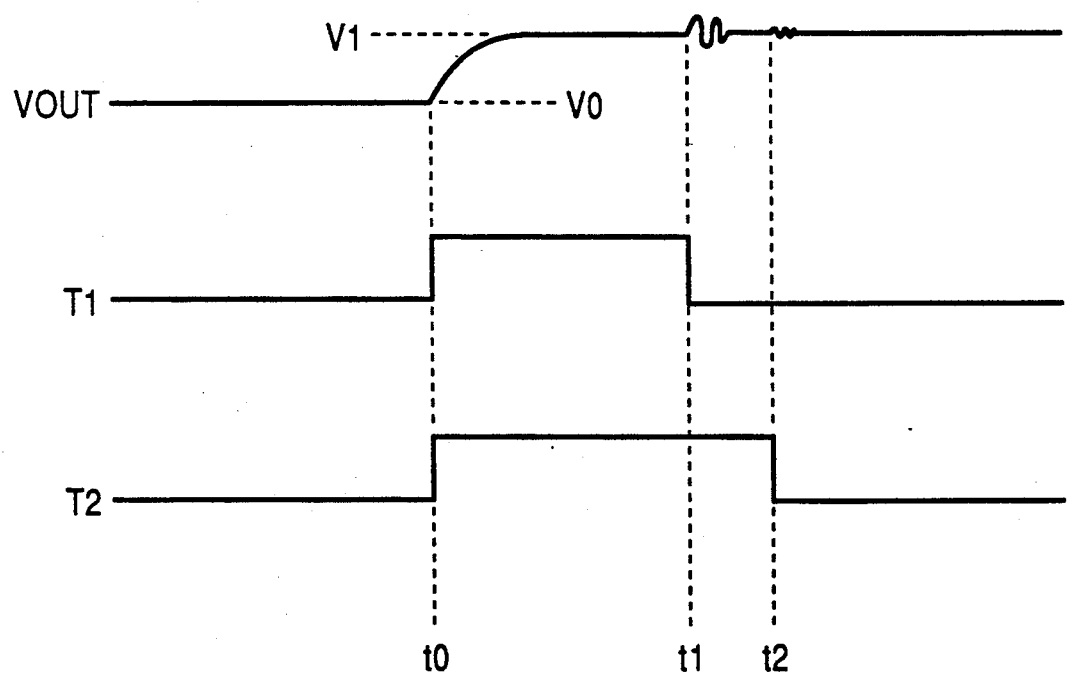
FIG. 2 is a timing diagram showing the timing and sequence of operation of the MOSFET switches of the circuit of FIG. 1.

The operation of the above-described sample-and-hold circuit will now be explained with reference to the timing diagram of FIG. 2, in which control signals $T_1$ and $T_2$, and the circuit output, $V_{OUT}$, are shown plotted against time. Prior to switch operation an analog signal to be sampled, identified as $V_{IN}$, having a potential of $V_1$ is provided to input terminal 10. At time $=t_0$, signals $T_1$ and $T_2$ are both set to a HIGH state causing transmission gates 14 and 16 to close. Signals $T_1$ and $T_2$ are thereafter set to a LOW state at time $t_1$ and $t_2$ respectively. Thus, for the time interval between $t_0$ and $t_1$ transmission gates 14 and 16 are both closed to charge storage capacitor 18 from an initial voltage of $V_0$ to $V_1$.

At $t=t_1$ transmission gate 14 opens which results in the disturbance seen in $V_{OUT}$ immediately following $t=t_1$. This disturbance is due to the charge injection characteristics of transmission gate 14. Gate 16 remains closed until $t=t_2$, however, allowing transients caused by gate 14 opening to settle before gate 16 opens. The turning of gate 16 also produces the relatively small disturbance in the output waveform seen immediately following $t=t_2$. The effect of gate 16 closing upon $V_{OUT}$ is insignificant due to the low charge injection characteristics designed into transistors 24 and 26.

The sample-and-hold circuit described above can be implemented as an integrated circuit or part thereof, or as a cell in a gate array. Acceptable values for transistor, capacitor and timing parameters are as follows: channel width for transistors 20 and 22: 13.2 microns; channel length for transistors 20 and 22: 2.5 microns; channel width for transistors 24 and 26: 5.2 microns; channel length for transistors 24 and 26: 3.5 microns; time interval between $t_0$ and $t_1$: 100 nanoseconds; time interval between $t_1$ and $t_2$: 10 nanoseconds; and capacitance of storage capacitor 18: picofarads.

It can thus be seen that there has been provided by the present invention a sample-and-hold circuit which is simple in construction, contains few elements, and requires little space when incorporated into an integrated circuit yet offers a substantially reduction in charge injection errors over prior art sample-and-hold circuits.

From the foregoing specification it will be clear to those skilled in the art that the present invention is not limited to the specific embodiment described and illustrated and that numerous modifications and changes are possible without departing from the scope of the present invention. For example, the transistor, capacitor and timing parameter values provided above are exemplary only and not intended to be limiting. It is not necessary that switches (transmission gates) 14 and 16 be closed at the same instant, as shown in FIG. 2. It is important only that switch 16 be closed for a period of time immediately succeeding the opening of switch 14 to settle transients introduced into $V_{OUT}$ by the operation of switch 14.

It should also be recognized that the above-described circuit without inclusion of storage capacitor 18 forms a low charge injection switch having applications outside of sample-and-hold circuits.

These and other variations, changes, substitutions and equivalents will be readily apparent to those skilled in the art without departing from the spirit and scope of the present invention. Accordingly, it is intended that the invention to be secured by Letters Patent be limited only by the scope of the appended claims.

What is claimed is:

1. A sample-and-hold circuit comprising:
   an input terminal for receiving an analog voltage signal;
   storage means for storing a charge representative of said analog voltage;
   a first MOS switch connected between said input terminal and said storage means for selectively providing a current path between said input terminal and said storage means for a first predetermined period of time so as to supply charge to said storage means, said first switch having a low on- r resistance; and
   a second MOS switch connected between said input terminal and said storage means for selectively providing a current path between said input terminal and said storage means for a second predetermined period of time so as to supply charge to said storage means, said second switch having low charge injection characteristics.

2. The sample-and-hold circuit according to claim 1, wherein a portion of said second predetermined period of time follows the conclusion of said first predetermined period of time.

3. The sample-and-hold circuit according to claim 2, wherein said first and second predetermined periods of time begin concurrently.

4. The sample-and-hold circuit according to claim 2, wherein said first and second MOS switches comprise first and second MOSFET transmission gates, respectively.

5. The sample-and-hold circuit according to claim 4, wherein:
   said first MOSFET transmission gate includes parallel-connected PMOS and NMOS field effect transistors each having a large channel width-to-length ratio; and
   said second MOSFET transmission gate includes parallel-connected PMOS and NMOS field effect transistors each having a small channel width-to-length ratio, said second transmission gate transistors each having a smaller channel width than said first transmission gate transistors.

6. The sample-and-hold circuit according to claim 5, wherein:
   said sample-and-hold circuit is implemented as an integrated circuit;

said second transmission gate transistors each have a channel width of 5.2 microns and a channel length of 3.5 microns; and said first transmission gate transistors each have a channel width of 13.2 microns and a channel length of 2.5 microns.

7. The sample-and-hold circuit according to claim 6, wherein:

said first predetermined period of time is one hundred nanoseconds; and said second period of time begins concurrently with said first period of time and is one hundred ten nanoseconds.

8. The sample-and-hold circuit according to claim 4, wherein said charge storage means comprises a capacitor.

9. A sample-and-hold method comprising the steps of:
charging or discharging a capacitor by an analog voltage signal along a low resistance signal path for a first predetermined period of time; and
charging or discharging said capacitor by said analog voltage signal along a low charge injection path for a second predetermined period of time.

10. The sample-and-hold method according to claim 9, wherein a portion of said second predetermined period of time follows the conclusion of said first predetermined period of time.

11. The sample-and-hold method according to claim 10, wherein said first and second predetermined periods of time begin concurrently.

* * * * *